United States Patent [19]

Ahn

[11] Patent Number: 5,612,246
[45] Date of Patent: Mar. 18, 1997

[54] METHOD FOR MANUFACTURING SEMICONDUCTOR SUBSTRATE HAVING BUCK TRANSISTOR AND SOI TRANSISTOR AREAS

[75] Inventor: Jong-Hyon Ahn, Suwon, Rep. of Korea

[73] Assignee: Samsung Electronics Co., Ltd., Suwon, Rep. of Korea

[21] Appl. No.: 549,441

[22] Filed: Oct. 27, 1995

[30] Foreign Application Priority Data

May 30, 1995 [KR] Rep. of Korea ...................... 95-13964

[51] Int. Cl.⁶ ...................................................... H01L 21/76
[52] U.S. Cl. .............................. 437/62; 437/152; 437/984
[58] Field of Search ............................ 437/62, 984, 152; 148/DIG. 85, DIG. 86

[56] References Cited

U.S. PATENT DOCUMENTS 4,889,829 12/1989 Kawai.
4,929,565 5/1990 Parillo.
5,476,809 12/1995 Kobayashi.
5,547,886 8/1996 Harada.

FOREIGN PATENT DOCUMENTS 529330 2/1993 Japan.

*Primary Examiner*—George Fourson

[57] ABSTRACT

A method for manufacturing a semiconductor substrate structure wherein a comprising the steps of defining bulk transistor and SOI transistor areas, the bulk transistor area disposed on a lower single crystalline silicon layer, and the SOI transistor area diposed on an upper single crystalline silicon layer. The method characterized in that a spacer is formed on a portion of the bulk transistor area which covers a sidewall of the SOI transistor area, a first conductive well is formed in the lower single crystalline silicon layer and a well oxide layer is formed over the first conductive well region, a second conductive well is formed in the lower single crystalline silicon layer between the SOI transistor layer and the first conductive well, and the first conductive well is rediffused.

8 Claims, 4 Drawing Sheets

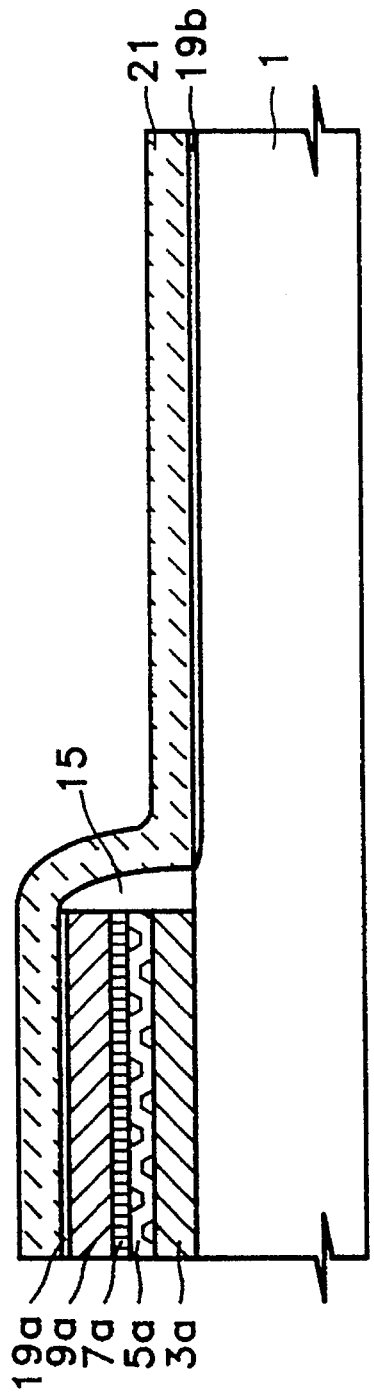
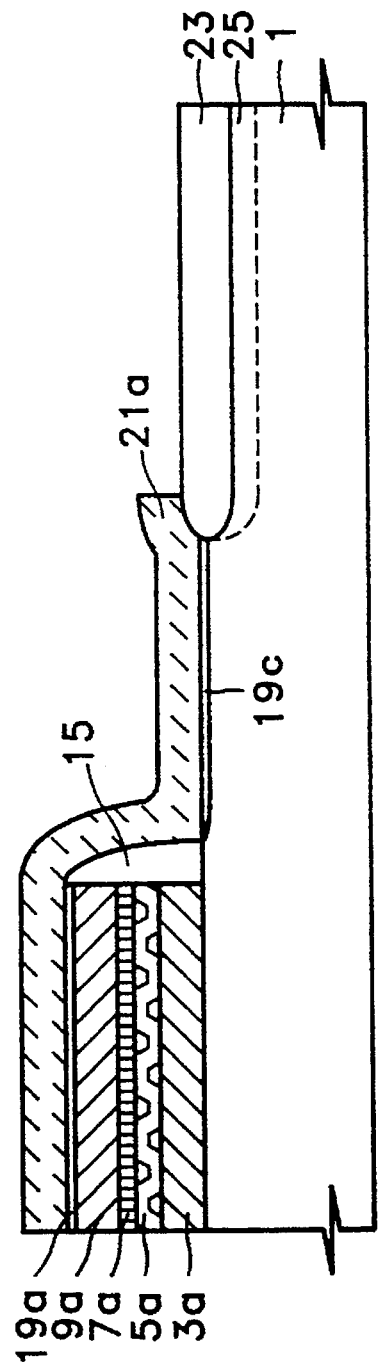

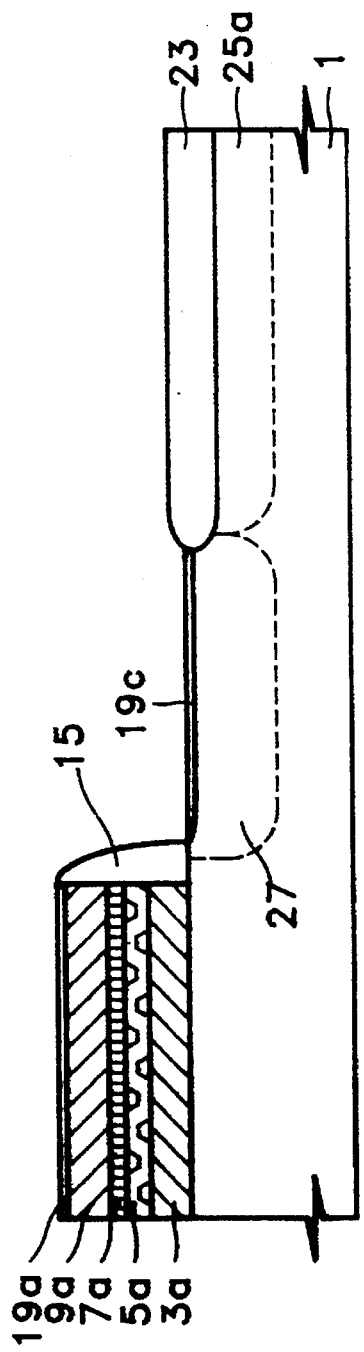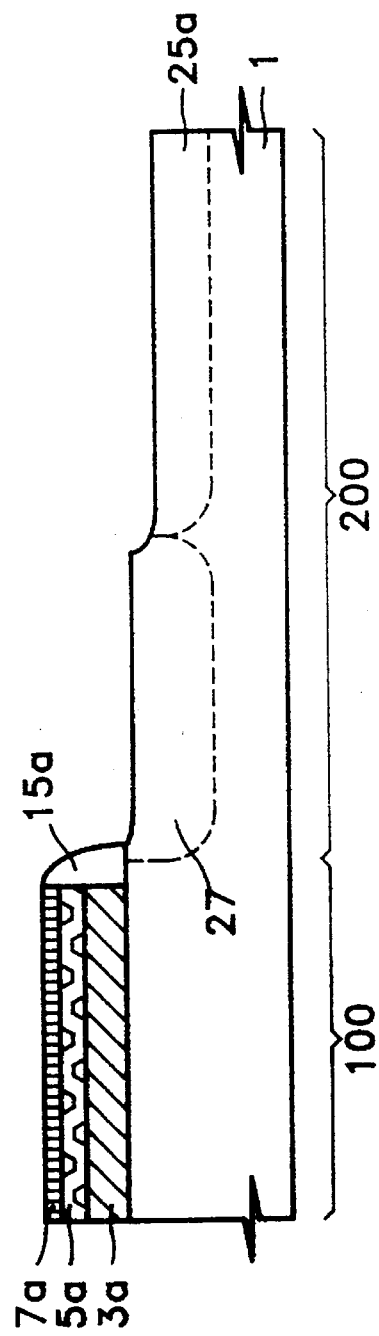

METHOD FOR MANUFACTURING SEMICONDUCTOR SUBSTRATE HAVING BUCK TRANSISTOR AND SOI TRANSISTOR AREAS

BACKGROUND OF THE INVENTION

The present invention relates to a method for manufacturing a semiconductor substrate and, more particularly, to a method for manufacturing a semiconductor substrate on which a high performance, silicon-on-insulator (SOI) transistor and a normal bulk transistor can be formed together.

As the level of semiconductor device integration increases, transistors having submicron channels are continuously being developed. In general, when the channel length of a bulk transistor decreases, various transistor performance properties degrade. Major examples of these performance property degradations include short-channel effects which lead to significant variations in the transistor threshold voltage depending on changes in channel length, and impaired driving capability for the transistor due to hot-carrier effects which occur around the drain junction. To overcome these problems, various drain structures, such as lightly doped drains (LDD) or double implanted LDDs (DI-LDDs), have been widely used. Other techniques which form a channel region having an appropriately adjusted impurity concentration distribution have similarly been used.

There is also an increasing tendency in contemporary semiconductor devices to lower the operating voltage, for example, from 5.0 V to 3.0 V or less. This reduction in operating voltage improves power dissipation and reliability in highly integrated semiconductor devices, but has adverse effects relative to the use of the remedial channel and drain structures previously discussed. For example, in order to obtain desirable transistor characteristics at lower operating voltages, transistor threshold voltages should be less than 0.5 V. This reduction in threshold voltages necessitates a decrease in the impurity concentration of channel regions. The decrease in the impurity concentration in the channel region leads to a significant increase in transistor subthreshold leakage current. In order to achieve the required low threshold voltage and constrain excessive flow of subthreshold leakage current, the subthreshold swing (hereinafter, referred to as S.S.) must be kept small. S.S. is defined as the gate voltage necessary for a ten-fold increase or a ten-fold decrease in drain current at the threshold voltage or below. S.S. can be expressed as $$S.S. \equiv \ln[dV_g/d(\ln I_{ds})]$$

$$\approx (kT/q)\ln(1+C_d/C_{ox})$$

wherein k equals Boltzman's constant of $1.38 \times 10^{-23}$ J/K, T is the absolute temperature, q is electrical charge of $1.60 \times 10^{-19}$ C, $C_d$ is the depletion capacitance, and $C_{ox}$ is the gate oxide capacitance.

As can be seen from the above equation, the value of S.S. can be reduced by increasing the gate oxide capacitance or reducing the depletion capacitance. To achieve this result, the gate insulating film should be thin, or the impurity concentrations around the source and drain junction and around the channel region should be low. However, in the case of a bulk transistor, the degree to which impurity concentrations around the source and drain junction can be reduced is limited. Thus, SOI transistors having lower source and drain junction capacitances have been used as a way around the foregoing problem.

U.S. Pat. No. 4,889,829 describes a method for manufacturing a semiconductor substrate on which a bulk transistor and a SOI transistor may be formed together, though its principle object is not to provide a semiconductor substrate for fabricating a low voltage semiconductor device. FIG. 1 is a cross-sectional view of a semiconductor substrate manufactured according the method disclosed in U.S. Pat. No. 4,889,829.

Referring to FIG. 1, reference numeral 300 denotes a substrate area in which a bulk transistor is formed, and reference numeral 400 denotes a substrate area upon which a SOI transistor is formed. Reference numeral 121 denotes a lower semiconductor substrate. Reference numerals 122 and 124 denote a thermal oxide layer formed over the entire surface of lower semiconductor substrate 121. Reference numeral 123 denotes an insulating layer formed on thermal oxide layer 122 through a CVD process. Reference numeral 127 denotes an upper semiconductor substrate in which the SOI transistor is formed. The upper semiconductor substrate 127 is a recrystallized silicon layer formed over a portion of insulating layer 123. Here, the recrystallized silicon layer is formed by a recrystallizing process using a laser beam to improve the electrical characteristics of the resulting SOI transistor. Reference numerals 129 and 130 denote field oxide layers for isolating devices. Reference numerals 131 and 132 denote a pad oxide layer and a pad nitride layer, respectively, which define active regions in which the respective transistors are formed following formation of field oxide layers 129 and 130. With this structure, and using the method set forth in U.S. Pat. No. 4,889,829, it is possible to form a bulk transistor and a SOI transistor together on a single substrate.

Unfortunately, this conventional method of manufacturing a semiconductor substrate has its problems. For example, this method requires that the SOI transistor be formed in a recrystallized silicon layer. The presence of the recrystallized silicon layer causes problems in terms of leakage current and contact resistance, as compared with a bulk transistor.

SUMMARY OF THE INVENTION

The present invention provides a method for manufacturing a semiconductor substrate upon which a SOI transistor having a low threshold voltage may be formed. The semiconductor device formed by the method of the present invention enjoys improved leakage current characteristics and contact resistance characteristics. Furthermore, a bulk transistor can be readily formed together with the SOI transistor.

To achieve these results, the present invention provides a method for manufacturing a semiconductor substrate comprising the steps of;

sequentially forming a first oxide layer, and a first oxidation resistant layer over a SOI substrate comprising a lower single crystalline silicon layer, a buried oxide layer formed over the lower single crystalline silicon layer, and an upper single crystalline silicon layer formed over the buried oxide layer, selectively removing a portion of the first oxidation resistant layer, the first oxide layer, the upper single crystalline silicon layer, and the buried oxide layer to expose a portion of the lower single crystalline silicon layer, the exposed portion of the lower single crystalline silicon layer forming a bulk transistor area, and the structure formed by the unremoved portion of the first oxidation resistant layer, the first oxide layer, the upper single crystalline silicon layer, and the buried oxide layer forming a SOI transistor area, forming a spacer on a portion of the bulk transistor area which covers a sidewall of the SOI transistor area, forming a second oxide layer over the bulk transistor area and the SOI transistor area, forming a second oxidation resistant layer over the second oxide layer, selectively removing a portion of the second oxidation resistant layer to expose a first portion of the second oxide layer overlaying the bulk transistor area, wherein a second portion of the second oxide layer is disposed between the exposed first portion of the second oxide layer and the spacer, and a third portion of the second oxide layer overlays the SOI transistor area, forming a first conductive well region in the lower single crystalline silicon layer beneath the first portion of the second oxide layer and forming a well oxide layer over the first conductive well region, removing the remaining portion of the second oxidation resistant layer, forming a second conductive well in the lower single crystalline silicon layer beneath the second portion of the second oxide layer, and a rediffused first conductive well beneath the the well oxide layer, and removing the well oxide layer, the second and third portions of the second oxide layer, and a remaining portion of the first oxidation resistant layer over SOI transistor area.

Within this method the step of forming a first conductive well region and forming a well oxide layer comprises the substeps of ion-implanting an impurity of first conductivity type into a portion of the lower single crystalline silicon layer beneath the first portion of the second oxide layer; and, performing a thermal oxidation process to simultaneously form the first conductive well region and the well oxide layer.

Also the step of forming a second conductive well and a rediffused the first conductive well comprises the substeps of ion-implanting an impurity of second conductivity type into a portion of the lower single crystalline silicon layer beneath the second portion of the second oxide layer using the well oxide layer as a mask, and heat treating the resulting structure to rediffuse the first conductive well.

The step of forming the spacer comprises the substeps of depositing a CVD oxide layer over the SOI transistor area and the bulk transistor area, and anisotropically etching the CVD layer to form the spacer.

According to the present invention, a semiconductor substrate structure having a SOI transistor area and a bulk transistor are is formed on an upper single crystalline silicon layer and an lower single crystalline silicon layer respectively. The resulting structure allows the subsequent formation of a SOI transistor having lower leakage current, lower contact resistance, and reduced subthreshold swing adjacent to a bulk transistor in a semiconductor device having excellent operating characteristics at reduced operating voltages.

BRIEF DESCRIPTION OF THE DRAWINGS

The foregoing objects and advantages of the present invention can be readily appreciated upon review of the following description of the preferred embodiment with reference to the attached drawings in which:

FIGS. 2A through 2F are related cross-sectional views showing a method for manufacturing a semiconductor substrate according to the present invention.

DETAILED DESCRIPTION OF THE INVENTION

A preferred embodiment of the present invention will be described with reference to the attached drawings.

Figure 1:
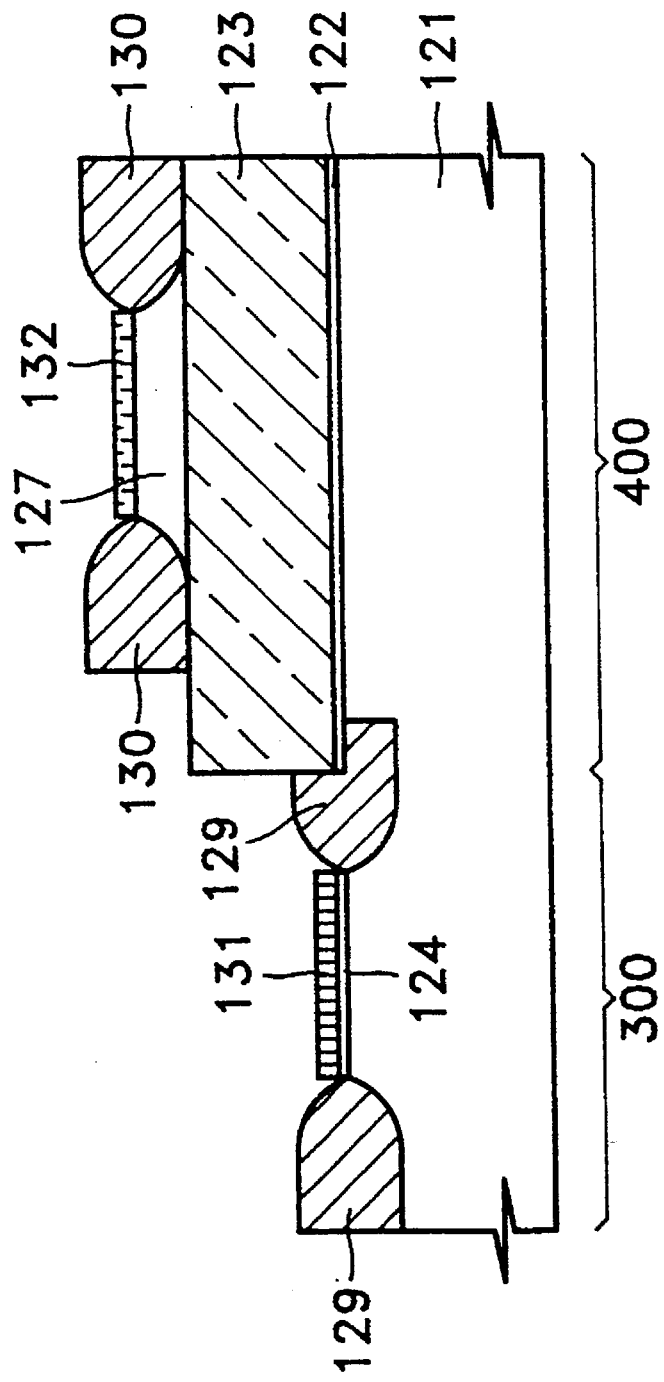
FIG. 1 is a cross-sectional view of a semiconductor substrate manufactured according to conventional technology.
Figure 2A:
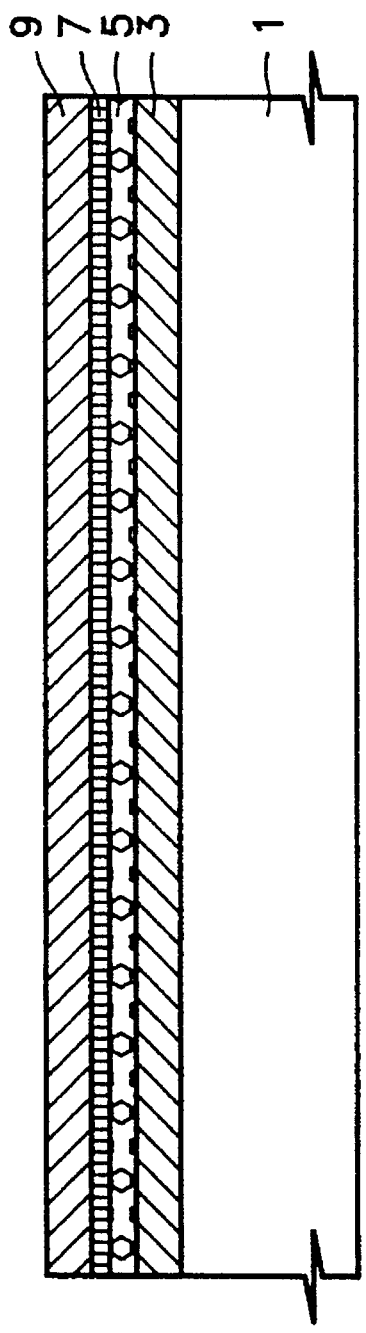

FIG. 2A illustrates the preliminary steps of sequentially forming a first oxide layer 7 and a first oxidation resistant layer 9, over a SOI substrate comprising a lower single crystalline silicon layer 1, a buried oxide layer 3 overlaying the lower single crystalline silicon layer 1, and an upper single crystalline silicon layer 5 formed over buried layer 3. A substrate formed by a separation by implanted oxygen (SIMOX) process, or a wafer bonding process is preferably used as the SOI substrate.

Figure 2B:
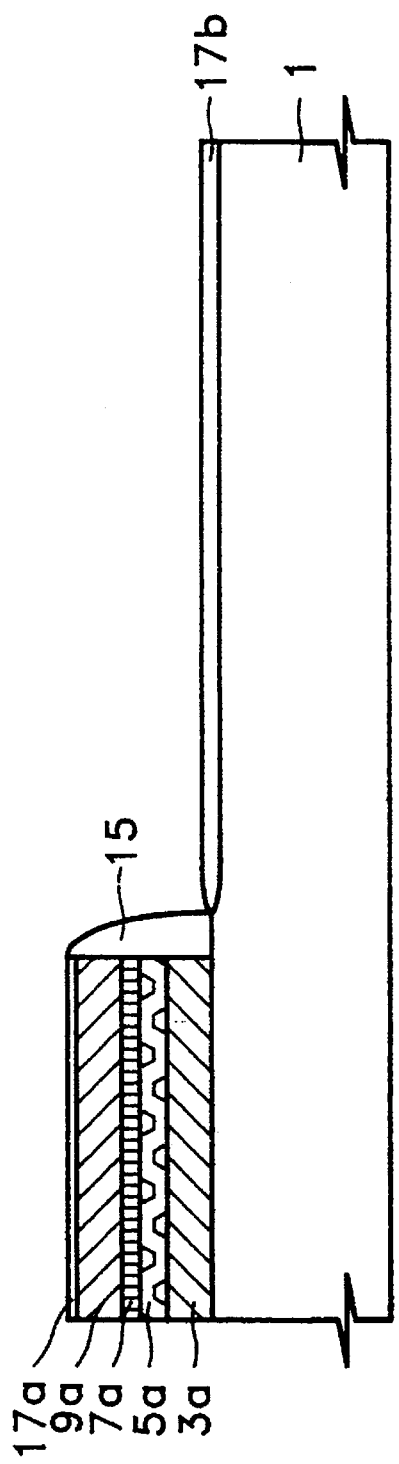

FIG. 2B illustrates the steps used to define substrate areas between a bulk transistor substrate area and a SOI transistor substrate area. First oxidation resistant layer 9, first oxide layer 7, upper single crystalline silicon layer 5, and buried oxide layer 3 are selectively and sequentially removed using conventional photolithographic processes, to expose a portion of lower single crystalline silicon layer 1 upon which the bulk transistor will be formed. This exposed portion of lower single crystalline silicon layer 1 is generally referred to the bulk transistor substrate area since following completion of the the semiconductor structure a bulk transistor will be formed in this area. The remaining portions of first oxidation resistant layer 9, first oxide layer 7, upper single crystalline silicon layer 5, and buried oxide layer 3 form the SOI transistor portion of the substrate.

Following the definition of the bulk transistor and SOI transistor areas, a CVD (chemical vapor deposition) oxide layer is deposited over the surface of the resultant structure and anisotropic-etched to form a spacer 15 on a sidewall of the SOI transistor area structure formed by the remaining portions of etched first oxidation resistant layer 9a, etched first oxide layer 7a, etched upper single crystalline silicon layer 5a, and etched buried oxide layer 3a. Subsequently, sacrificial oxide layers 17a and 17b are respectively formed on the surface of etched first oxidation resistant layer 9a and on the surface of the exposed portion of lower single crystalline silicon layer 1, by growing a thermal oxide layer on the entire surface of the substrate once spacer 15 has been formed. Sacrificial oxide layers 17a and 17b are formed for the purpose of removing crystalline defects occurring in the surface of lower single crystalline silicon layer 1 as a result of the anisotropic etching performed to form spacer 15.

FIG. 2C illustrates the steps used to form second oxide layers 19a and 19b and a second oxidation resistant layer 21 which are subsequently used to form a well receiving the bulk transistor structure. First, sacrificial oxide layers 17a and 17b are removed by a wet etching process. Thereafter, second oxide layers 19a and 19b, e.g. thermal oxide layers, and second oxidation resistant layer 21, e.g. a nitride silicon layer are sequentially formed over the entire resulting surface of the substrate. Here, second oxide layers 19a and 19b are formed respectively on the surface of the SOI transistor area and the bulk transistor area.

FIG. 2D illustrates the steps used to form a first conductive well 25 and well oxide layer 23. Second oxidation resistant layer 21 is selectively etched using a conventional photolithographic process to expose a first portion of second oxide layer 19b formed on the surface of lower single crystalline silicon layer 1. The unexposed portion of second oxide layer 19c formed on the surface of lower single crystalline silicon layer 1 is referred to as the second portion of the second oxide layer. Finally, the portion of second oxide layer designated 19a is referred to as the third portion of the second oxide layer.

Once the first portion of the second oxide layer has been exposed, a thermal oxidization process is performed after ion-implanting of an impurity of first conductivity type into the exposed portion of second oxide layer 19b, to thereby simultaneously form a well oxide layer 23 having a thickness of 2000 Å–6000 Å, for example, and a first conductive well 25 beneath well oxide layer 23. Here, since exposed second oxide layer 19b is consumed in well oxide layer 23, a residual (second) portion of second oxide layer 19c remains between etched second oxidation resistant layer 21a and lower single crystalline silicon layer 1.

FIG. 2E illustrates the steps used to form a second conductive well 27 and a rediffused first conductive well 25a. The remaining (unetched) portion of second oxidation resistant layer 21a is removed using a wet etching process. Thereafter, thermal processing is performed at high temperature after ion-implanting of an impurity of second conductivity type into a region below the second portion of the second oxide layer 19c using well oxide layer 23 as an ion-implanting mask, to thereby simultaneously form second conductive well 27 and rediffused first conductive well 25a. Here, second conductive well 27 is formed adjacent to upper single crystalline silicon layer 5a.

FIG. 2F illustrates the steps used to complete the semiconductor substrate structure according to the present invention. Well oxide layer 23 and second and third portions of second oxide layer, 19a and 19c, are removed by a wet etching process. Here, in the case where spacer 15 was formed of a CVD oxide layer, spacer 15 is also etched into form a modified (smaller) spacer 15a. Thereafter, the SOI transistor area, denoted by reference numeral 100, and the bulk transistor area, denoted by reference numeral 200, are formed by removing first oxidation resistant layer 9a from the SOI transistor area. Subsequently, though not shown, a semiconductor device having the SOI transistor and the bulk transistor together on one substrate is completed by performing conventional device isolation processes and a transistor formation processes on the resulting substrate structure.

According to the foregoing exemplary embodiment of the present invention, a high performance SOI transistor having lower leakage current and lower source and drain contact resistance, as compared with a SOI transistor formed on a conventional recrystallized silicon layer, can be realized with a bulk transistor on one substrate. This result is possible because the SOI transistor is formed on a single crystalline silicon layer without the need for a second recrystallized silicon layer. Such a SOI transistor has much less parasitic capacitance in its source and drain junction than a bulk transistor, thereby attaining a lower subthreshold swing. Consequently, a semiconductor device having excellent operational characteristics at lower operating voltage can be formed on the semiconductor substrate structure of the present invention.

The present invention is not restricted to the above described embodiment which has been given by way of an example. It will be understood by those of ordinary skill in the art that design and process variations may be made to the foregoing example which are well within the scope and spirit of the present invention as defined by the following claims.

What is claimed is:

1. A method for manufacturing a semiconductor substrate structure, comprising the steps of:

sequentially forming a first oxide layer, and a first oxidation resistant layer over a SOI substrate comprising a lower single crystalline silicon layer, a buried oxide layer formed over the lower single crystalline silicon layer, and an upper single crystalline silicon layer formed over the buried oxide layer;

selectively removing a portion of the first oxidation resistant layer, the first oxide layer, the upper single crystalline silicon layer, and the buried oxide layer to expose a portion of the lower single crystalline silicon layer, the exposed portion of the lower single crystalline silicon layer forming a bulk transistor area, and the structure formed by the unremoved portion of the first oxidation resistant layer, the first oxide layer, the upper single crystalline silicon layer, and the buried oxide layer forming a SOI transistor area;

forming a spacer on a portion of the bulk transistor area which covers a sidewall of the SOI transistor area;

forming a second oxide layer over the bulk transistor area and the SOI transistor area;

forming a second oxidation resistant layer over the second oxide layer;

selectively removing a portion of the second oxidation resistant layer to expose a first portion of the second oxide layer overlaying the bulk transistor area, wherein a second portion of the second oxide layer is disposed between the exposed first portion of the second oxide layer and the spacer, and a third portion of the second oxide layer overlays the SOI transistor area;

forming a first conductive well region in the lower single crystalline silicon layer beneath the first portion of the second oxide layer and forming a well oxide layer over the first conductive well region;

removing the remaining portion of the second oxidation resistant layer;

forming a second conductive well in the lower single crystalline silicon layer beneath the second portion of the second oxide layer, and a rediffused first conductive well beneath the the well oxide layer; and removing the well oxide layer, the second and third portions of the second oxide layer, and a remaining portion of the first oxidation resistant layer over SOI transistor area.

2. The method of claim 1, wherein the step of forming a first conductive well region and forming a well oxide layer comprises the substeps of:

ion-implanting an impurity of first conductivity type into a portion of the lower single crystalline silicon layer beneath the first portion of the second oxide layer; and, performing a thermal oxidation process to simultaneously form the first conductive well region and the well oxide layer.

3. The method of claim 2, wherein the exposed first portion of the second oxide layer is consumed in the substep of performing a thermal oxidation process.

4. The method of claim 2, wherein the step of forming a second conductive well and a rediffused the first conductive well comprises the substeps of:

ion-implanting an impurity of second conductivity type into a portion of the lower single crystalline silicon layer beneath the second portion of the second oxide layer using the well oxide layer as a mask; and, heat treating the resulting structure to rediffuse the first conductive well.

5. The method of claim 1, wherein the first oxidation resistant layer and the second oxidation layer are formed of nitride silicon.

6. The method of claim 1, wherein the first oxide layer and second oxide layer are formed by a thermal process.

7. The method of claim 1, wherein the step of forming a spacer comprises the substeps of:

depositing a CVD oxide layer over the SOI transistor area and the bulk transistor area; and, anisotropically etching the CVD layer to form the spacer.

8. The method of claim 7, further comprising the step of:

performing a thermal oxidation process to form sacrificial oxide layers over the SOI transistor area and the bulk transistor area following the formation of the spacer; and, removing the sacrificial oxide layers to reduce crystalline defects in the surface of the lower single crystalline silicon layer.

* * * * *